US012763725B2

(12) United States Patent
Rieh et al.

(10) Patent No.: US 12,763,725 B2
(45) Date of Patent: Oct. 13, 2026

(54) INJECTION LOCKED OSCILLATOR ARRAY CIRCUIT DEVICE AND METHOD FOR DESIGNING INJECTION LOCKING CIRCUIT IN SUB-MMWAVE BAND

(71) Applicant: KOREA UNIVERSITY RESEARCH AND BUSINESS FOUNDATION, Seoul (KR)

(72) Inventors: Jae Sung Rieh, Seoul (KR); Gi Yeong Nam, Suwon-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 19/034,212

(22) Filed: Jan. 22, 2025

(65) Prior Publication Data

US 2025/0175124 A1 May 29, 2025

(30) Foreign Application Priority Data

Mar. 25, 2024 (KR) ........................ 10-2024-0040426

(51) Int. Cl.
*H03B 5/02* (2006.01)

(52) U.S. Cl.
CPC ..................................... *H03B 5/02* (2013.01)

(58) Field of Classification Search
CPC ...... H03B 5/02; H03B 2200/009; H03B 1/04; H03B 2200/0074
USPC ........................................................... 331/50
See application file for complete search history.

(56) References Cited

U.S. PATENT DOCUMENTS 8,314,742 B2 * 11/2012 Fujita .................. H01Q 25/008 342/368
2020/0119742 A1 * 4/2020 Jain ........................... H03L 7/22

FOREIGN PATENT DOCUMENTS

JP 2006094333 * 4/2006
JP 2008289098 * 11/2008

OTHER PUBLICATIONS

Office Action for KR 10-2024-0040426 by Ministry of Intellectual Property dated Apr. 14, 2026.
Pogorzelski, Ronald J. et al., "Two-Dimensional Array Beam Scanning via Externally and Mutually Injection-Locked Coupled Oscillators," IEEE Transactions on Antennas and Propagation, vol. 49, Issue: 2, DOI: 10.1109/8.914291, Feb. 2001.
Birkeland, Joel et al., "A 16 element quasi-optical FET oscillator power combining array with external injection locking," IEEE Transactions on Microwave Theory and Techniques, vol. 40, Issue: 3, DOI: 10.1109/22.121722, Mar. 1992.

* cited by examiner

*Primary Examiner* — Richard Tan
(74) *Attorney, Agent, or Firm* — BROADVIEW IP LAW, PC

(57) ABSTRACT

Disclosed is an injection locked oscillator array circuit device and method for designing injection locking circuit in sub-millimeter wave band. An injection locked oscillator array circuit device comprises: an oscillator array comprising a plurality of oscillators arranged in a square matrix; an injection locking circuit configured to inject an injection locking signal into some of the oscillators in the oscillator array.

3 Claims, 6 Drawing Sheets

(a)

(b)

INJECTION LOCKED OSCILLATOR ARRAY CIRCUIT DEVICE AND METHOD FOR DESIGNING INJECTION LOCKING CIRCUIT IN SUB-MMWAVE BAND

CROSS-REFERENCE TO RELATED APPLICATION

This application claims under 35 U.S.C. § 119(a) the benefit of Korean Patent Application No. 10-2023-0165402 filed on Nov. 24, 2023, and Korean Patent Application No. 10-2024-0040426 filed on Mar. 25, 2024, the entire contents of which are incorporated herein by reference.

BACKGROUND

(a) Technical Field

The present disclosure relates to an injection locked oscillator array circuit device and method for designing injection locking circuit in sub-millimeter (mm) wave band.

(b) Background Art

High-frequency communication systems and radar systems require ultra-fast, large-capacity data transmission and high-precision distance resolution, among other characteristics, which necessitate precise signal sources with low phase noise. Injection-locked oscillators have the characteristic of being injection-locked to the frequency of the external signal when a signal with a frequency similar to the oscillation frequency is injected, resulting in a low phase noise.

FIG. 1 shows a conventional arrangement of injection-locked oscillators.

The conventional injection-locked oscillator array, as shown in FIG. 1, applies the injection-locking signal to each oscillator individually. In the case of a 4×4 oscillator array, the injection-locking signal is divided into 16 parts, with each part being applied to a different oscillator.

In injection-locked oscillators, in order for each oscillator to generate signals with identical phases, the injection-locking signal must be perfectly in phase with each other. Therefore, instead of injecting 16 signals at once, as shown in FIG. 2, the process is repeated four times through a Wilkinson power divider, where the signal is divided into two at each step, and ultimately injected into each oscillator. The signal strength injected into each oscillator is 1/16th of the original signal strength, and due to additional losses from passing through the four dividers, the injected signal strength becomes even smaller.

As shown in Equation 1, the injection-locked oscillator achieves better frequency locking with higher signal strength. However, when the injection-locking signal is divided multiple times as in the conventional method, the reduced signal strength leads to poor injection locking, which is a problem.

$$\omega_L \approx \frac{\omega_0}{2Q} \cdot \frac{I_{inj}}{I_{OSC}} \qquad \text{[Equation 1]}$$

Additionally, while it is possible to increase the signal strength by adding a buffer in the middle of the injection locking circuit, in high-frequency bands such as the sub-millimeter wave range, the power gain of semiconductor devices is low, making it difficult to design the buffer, thus limiting the ability to boost the signal strength.

In the case of the conventional injection-locked oscillator array circuit, as shown in FIG. 1, the injection locking signal passes through multiple power splitters, increasing the design complexity. Furthermore, in an LC cross-coupled oscillator structure, differential signals must be injected at both ends of the oscillator for injection locking. When each differential signal is divided through a splitter and injected into each oscillator in the array, the length of the circuit for injection locking becomes longer, and there are limitations in implementing the layout.

SUMMARY OF THE DISCLOSURE

The present disclosure is to provide an injection locked oscillator array circuit device and an injection locking circuit design method.

The present disclosure is to provide an injection locked oscillator array circuit device and an injection locking circuit design method that minimize the number of power splitters and reduce the length of transmission lines by injecting the injection locking signal into only some of the oscillators in a sub-millimeter wave band injection-locked oscillator, thereby reducing the complexity of the injection locking circuit.

According to an aspect of the present disclosure, provided is an injection locked oscillator array circuit device.

According to an embodiment of the present disclosure, an injection locked oscillator array circuit device may be provided, which comprises: an oscillator array comprising a plurality of oscillators arranged in a square matrix; an injection locking circuit configured to inject an injection locking signal into some of the oscillators in the oscillator array.

The oscillator array comprises the oscillators arranged in an N×N square matrix, each oscillator forming the oscillator array is phase-coupled to each other via a coupling network, and the oscillators are injected-locked oscillators operating in the sub-millimeter wave band of 300 GHz or higher.

The injection locking circuit is configured to inject the injection locking signal into some of the oscillators located a symmetric structure within the oscillator array.

the injection locking circuit comprises: a first power divider configured to distribute the injection locking signal and output the distributed signals through a first transmission line and a second transmission line; a second power divider configured to distribute the signal delivered through the first transmission line and inject the distributed signals into a first oscillator and a second oscillator among the oscillators via a third transmission line and a fourth transmission line; and a third power divider configured to distribute the signal delivered through the second transmission line and inject the distributed signals into a third oscillator and a fourth oscillator among the oscillators via a fifth transmission line and a sixth transmission line.

The first oscillator, the second oscillator, the third oscillator and the fourth oscillator are oscillators located at the corners of the N×N array.

The first oscillator, the second oscillator, the third oscillator and the fourth oscillator are oscillators located in the same row or the same column of the N×N array.

According to another aspect of the present disclosure, provided is a method of designed an injection-locked oscillator circuit.

According to the embodiment of the present disclosure, a method of designed an injection-locked oscillator circuit may be provided, comprising the step of: arranging a plurality of oscillators to form a square matrix; placing an injection locking circuit to inject an injection locking signal into some of the oscillators in the square matrix; wherein the oscillators into which the injection locking signal is injected are located in a symmetric structure.

DETAILED DESCRIPTION

A singular form used in this specification includes a plural form unless the context clearly dictates otherwise. In this specification, a term such as "comprising" or "including" should not be construed as necessarily including all various components or various steps disclosed in this specification, and it should be construed that some component or some steps among them may not be included or additional components or steps may be further included. In addition, the terms including "unit', "module", and the like disclosed in this specification mean a unit that processes at least one function or operation and this may be implemented by hardware or software or a combination of hardware and software.

Hereinafter, the embodiment of the present disclosure will be described in detail with reference to the accompanying drawings.

Figure 3:
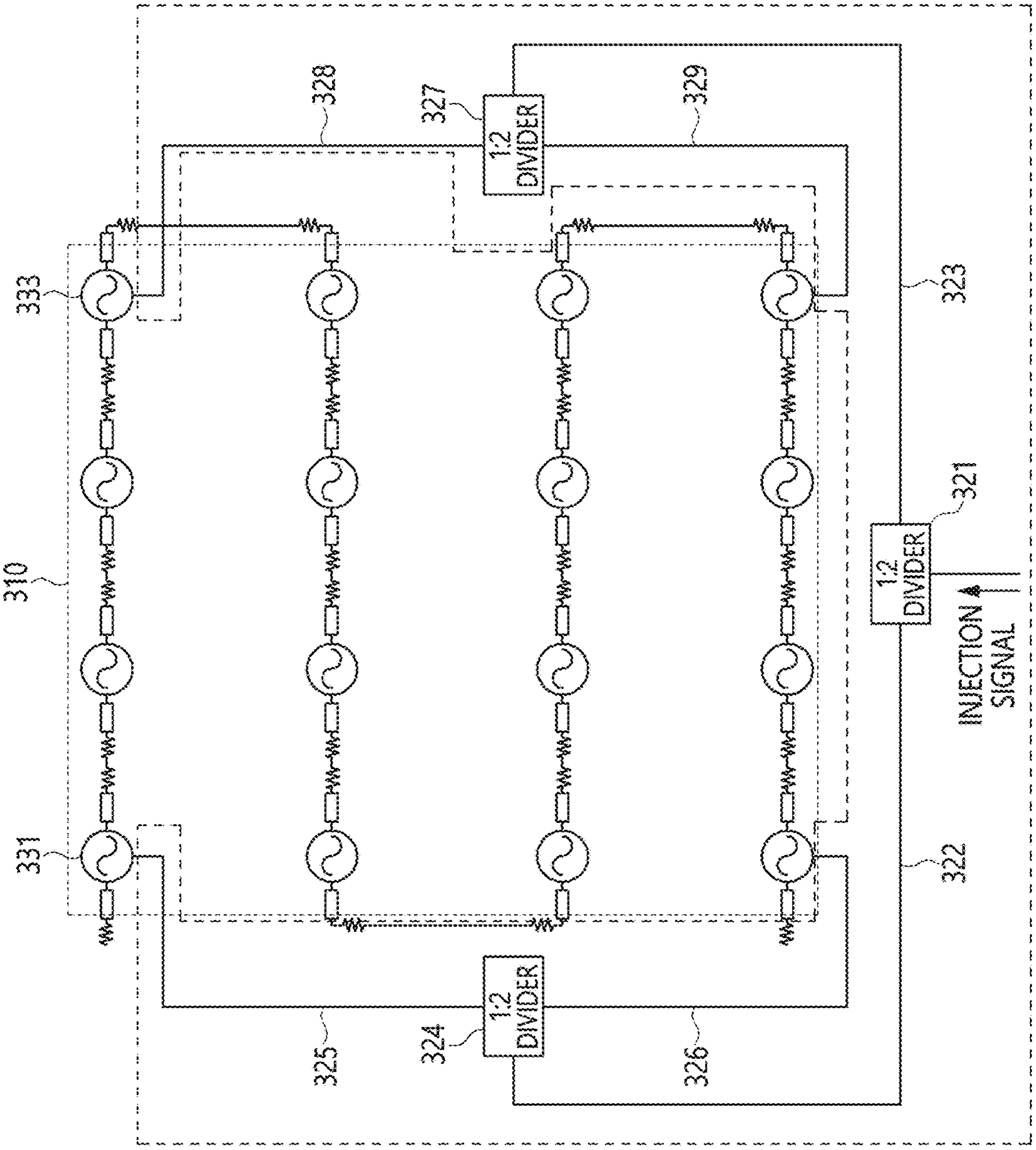
FIG. 3 is a diagram illustrating an injection locked oscillator array circuit device according to an embodiment of the present disclosure.

FIG. 3 is a diagram illustrating a detailed configuration of an injection locked oscillator array circuit device according to an embodiment of the present disclosure.

Referring to FIG. 3, the injection locked oscillator array circuit device according an embodiment of the present disclosure has an N×N oscillator array (310). Wherein N is a nature number and may be a nature number greater than or equal to 3.

According to an embodiment of the present disclosure, the oscillator array (310) can have oscillators arranged in a symmetric structure. For example, the oscillator array (310) can be arranged to form a square matrix, wherein the same number of oscillators are arranged in rows and columns, such as 3×3, 4×4, 5×5, and so on. Hereinafter, in this embodiment of the present disclosure, it will be assumed that the oscillator array (310) is arranged as a 3×3 or 4×4 square matrix, and the description will focus on this arrangement.

Additionally, it is assumed that the oscillators arranged in the square matrix are phase-coupled to each other through a coupling network.

Furthermore, according to an embodiment of the present disclosure, the oscillators may be injection-locked oscillators operating in the sub-millimeter wave band of 300 GHz or higher.

Unlike the low-frequency band, in high-frequency bands such as the sub-millimeter wave band, even if an amplifier is provided in the injection locking circuit (320), the amplifier gain is not significant, and there is a major disadvantage of considerable power loss in the power divider.

Figure 1:
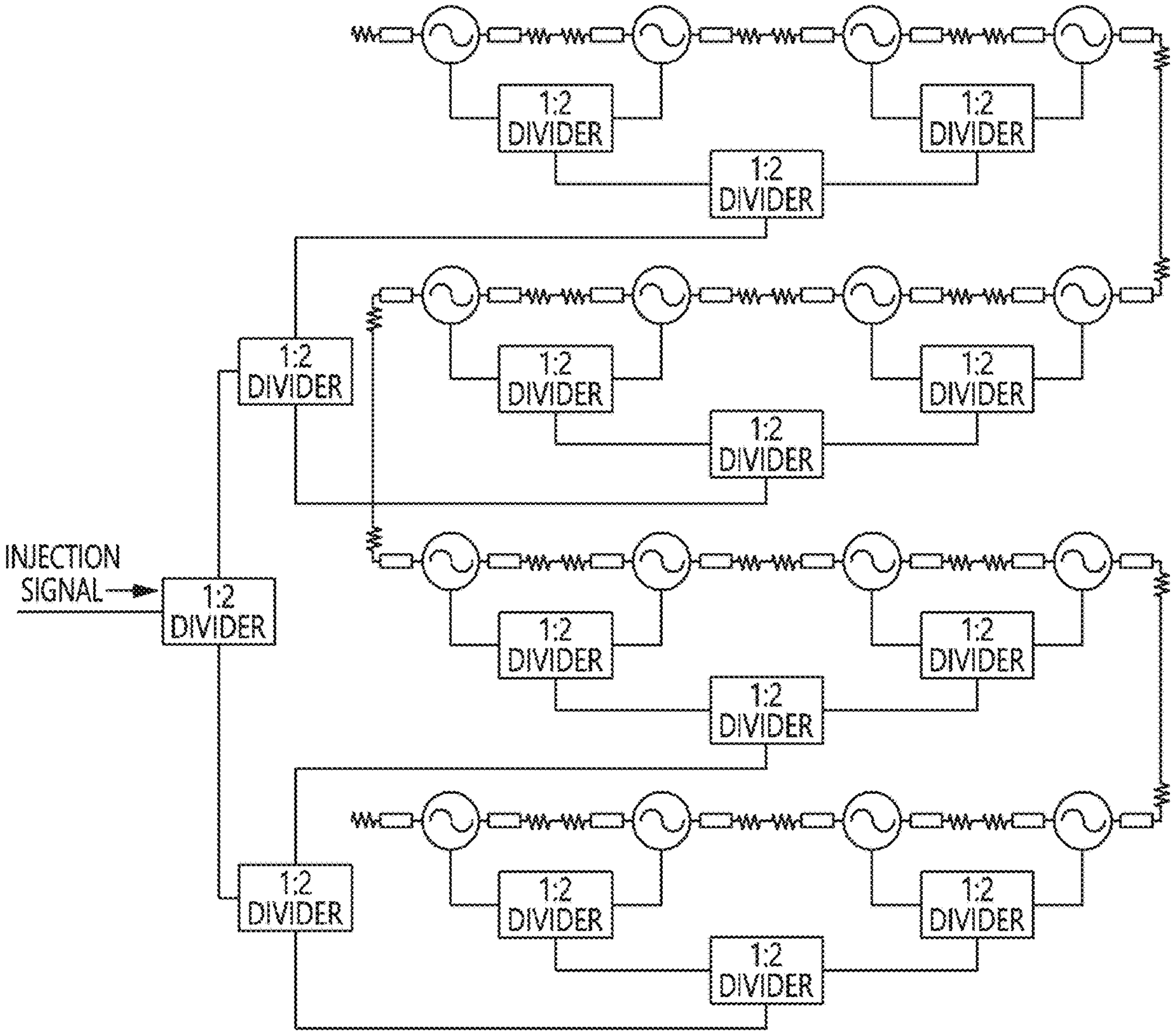
FIGS. 1 to 2 are diagrams illustrating the related art.
Figure 2:
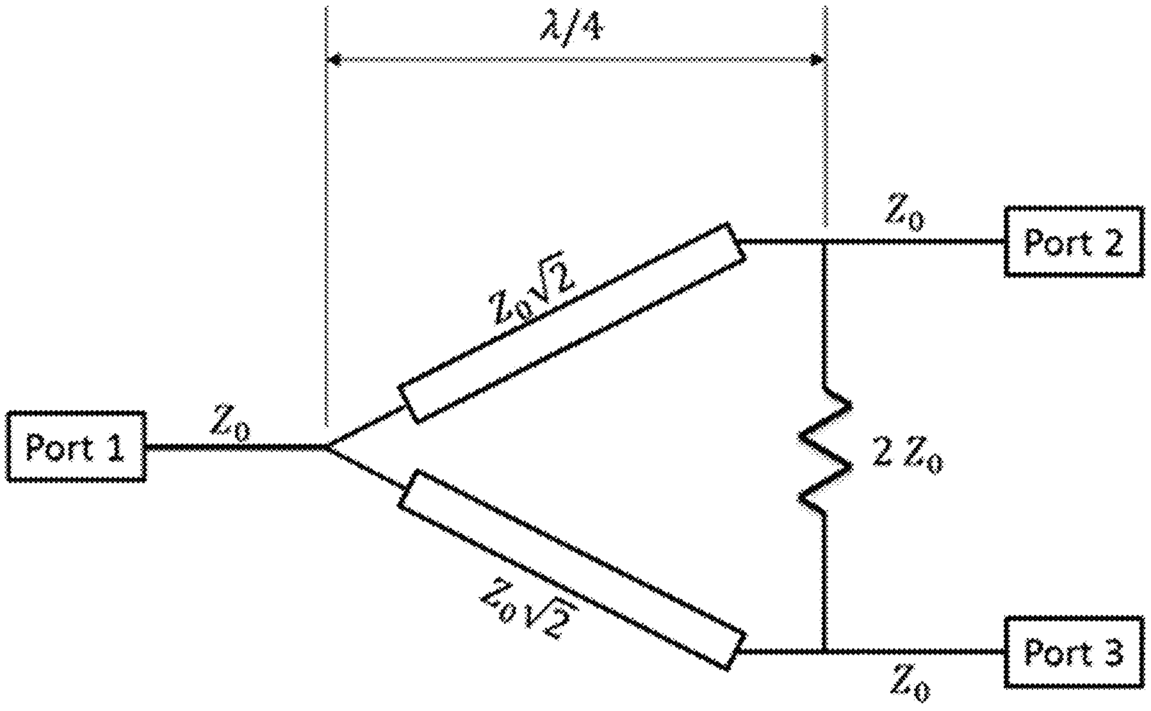

As a result, the oscillators operating in high-frequency bands such as the sub-millimeter wave band, as in an embodiment of the present disclosure, can improve the intensity of each injection locking signal compared to the prior art in FIG. 1 and inject the injection locking signal into only some of the oscillators.

The injection locking circuit (320) is configured to include a first power divider (321), a second power divider (324), and a third power divider (327).

This injection locking circuit (320) is arranged to inject an injection locking signal into some of the oscillators in a plurality of oscillators arranged in a square matrix, with the oscillators receiving the injection locking signal being located in a symmetric structure. The first power divider (321) distributes the injection locking signal and the transmits it through a first transmission line (322) and a second first transmission line (323) to the second power divider (324) and the third power divider (327).

The second power divider (322) distributes the transmitted signal through the first transmission line (322) and injects the injection locking signal into a first oscillator (331) and a second oscillator (332) though a third transmission line (325) and a fourth transmission line (326). The third power divider (327) distributes the transmitted signal through the second transmission line (323) and injects the injection locking signal into a third oscillator (333) and a fourth oscillator (334) though a fifth transmission line (328) and a sixth transmission line (329).

Wherein the first oscillator (331), the second oscillator (332), the third oscillator (333) and fourth oscillator (334) do not refer to the order of the oscillator array, but should be understood as referring to the indices of the oscillators into which the injection locking signal is injected.

According to an embodiment of the present disclosure, the injection locking circuit (320) is configured such that the injection locking signal is injected into only some of the oscillators in the oscillator array arranged in a square matrix with a symmetric structure. The arrangement of the first power divider (321) to the third power divider (327), and the first transmission line (322) to the fourth transmission line (326), can be determined for this purpose.

For example, the injection locking circuit (320) can be configured such that the injection locking signal is injected into only the oscillators located at the corners of the oscillator array arranged in a square matrix, with the arrangement of the first power divider (321) to the third power divider (327) and the first transmission line (322) to the fourth transmission line (326) being determined accordingly.

That is, the second power divider (324) can inject the injection locking signal into the first oscillator located at the top-left corner and the second oscillator located at the bottom-left corner of the oscillator array arranged in a square matrix. Additionally, the third power divider (327) can inject the injection locking signal into only the third oscillator located at the top-right corner and the fourth oscillator located at the bottom-right corner of the oscillator array arranged in a square matrix.

Therefore, according to an embodiment of the present disclosure, the first power divider (321) is arranged at the upper or lower center of the oscillator array (310) arranged in a square matrix, the second power divider (324) is arranged at the left-center position of the oscillator array (310) arranged in a square matrix, and the third power divider (327) can be arranged at the right-center position of the oscillator array (310) arranged in a square matrix.

As a result, the transmission lines connecting the oscillators (the first oscillator (331) to the fourth oscillator (334)) located at each corner of the N×N square matrix oscillator array can also be designed to be arranged in a symmetric structure. This allows, according to an embodiment of the present disclosure, not only minimizing signal loss through the transmission lines but also providing the advantage of injection locking at lower signal intensities.

As another example, the injection locking circuit (320) may inject the injection locking signal into only the oscillators located in the same row or the same column of the oscillator array arranged in a square matrix. That is, the injection locking circuit (320) may inject the injection locking signal into only the first oscillator, second oscillator, third oscillator, and fourth oscillator arranged in the first column. Additionally, the injection locking circuit (320) may inject the injection locking signal into only the first oscillator, second oscillator, third oscillator, and fourth oscillator arranged in the first row.

The injection locking circuit (320) injects the injection locking signal into only some of the oscillators in the oscillator array arranged in a square matrix, and if the oscillators receiving the signal also have a symmetric structure, this can be applied without limitation.

As shown in FIGS. 3 and 7, when the injection locking signal is injected into only the four oscillators located at the corners of a 4×4 oscillator array, the number of 1:2 power dividers is significantly reduced to three, and the length of the required transmission lines is also shortened. This not only reduces losses but also provides the advantage of greatly reducing the complexity of the injection locking circuit.

Figure 4:
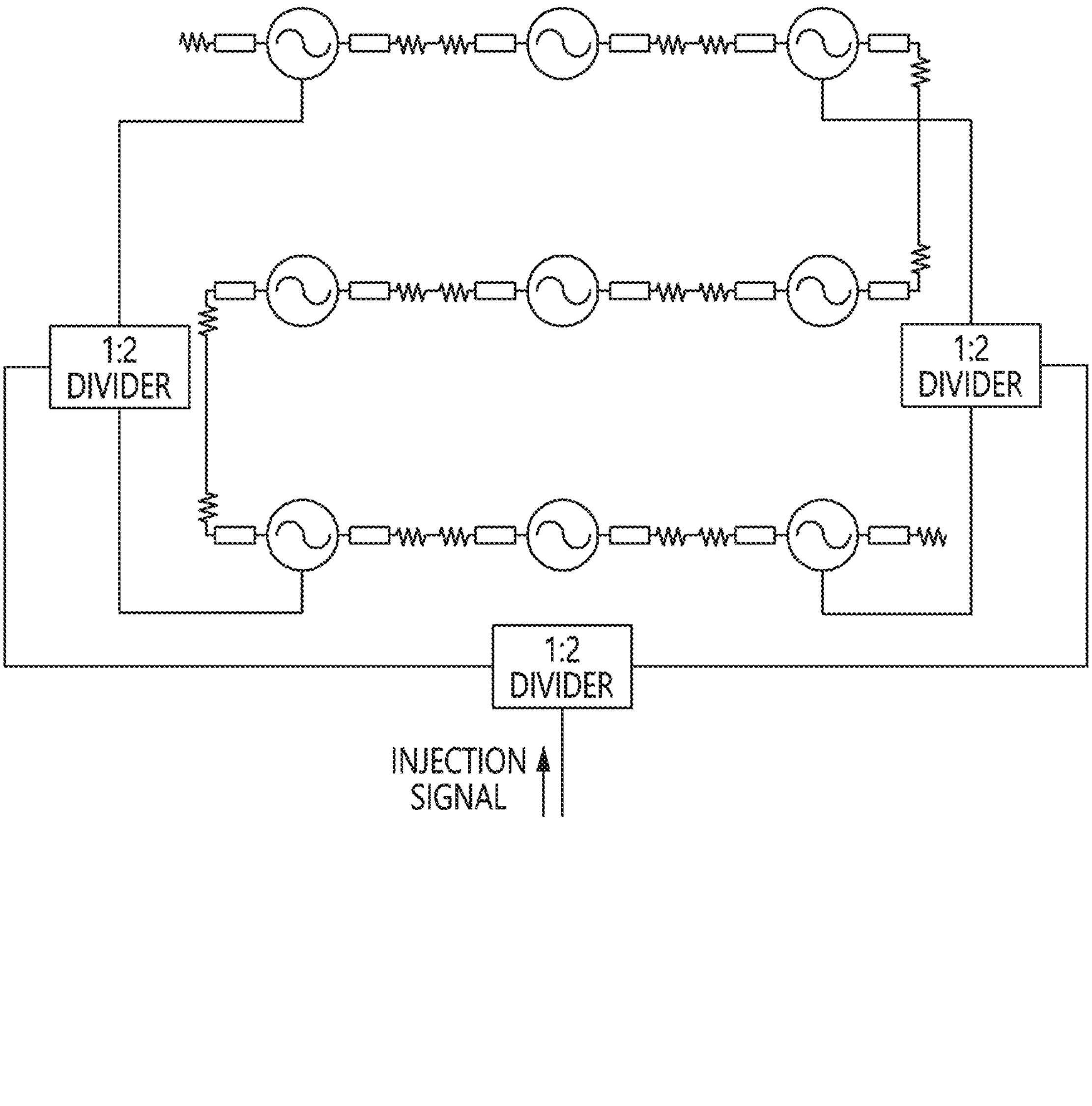
FIG. 4 is a diagram showing an example where the injection locking signal is injected only into some oscillators of a 3×3 oscillator array according to an embodiment of the present disclosure.

FIG. 4 is a diagram illustrating an example where the injection locking signal is injected into only some of the oscillators in a 3×3 oscillator array.

Figure 5:
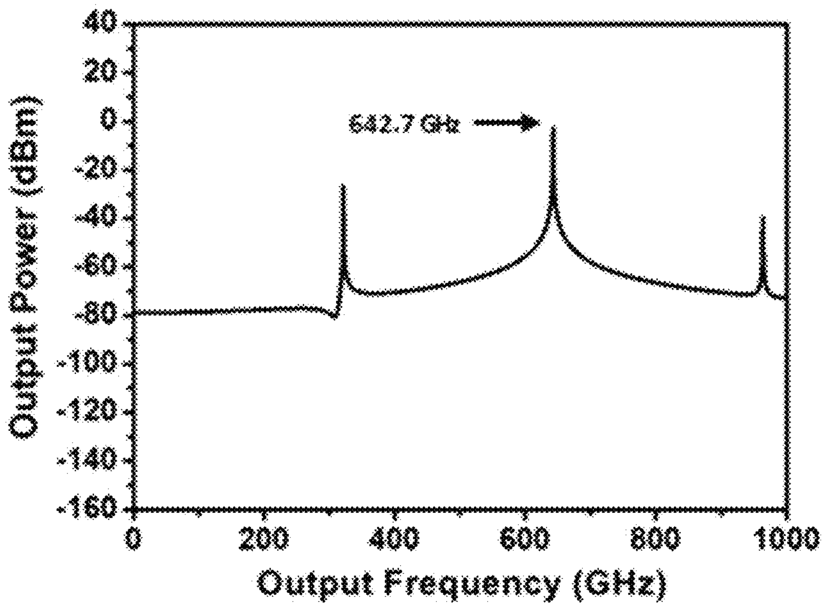
FIG. 5 is a diagram showing the simulation results based on whether the signal is injected into the injection locking oscillator array of FIG. 4.
Figure 5:
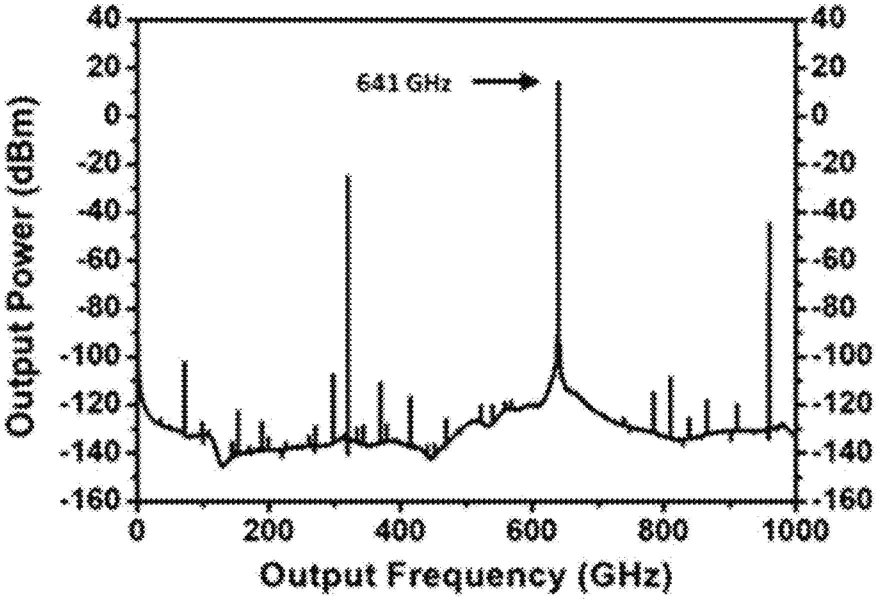

FIG. 5 shows the simulation results based on whether a signal is injected into the injection locked oscillator array.

In FIG. 5, (a) shows the simulation results when no fixed injection signal is applied to the injection locked oscillator array, and (b) shows the simulation results when a fixed injection signal is injected into the injection locked oscillator array.

As shown in FIG. 5, when the injection locking signal is injected into only some of the oscillators in the oscillator array with a symmetric structure, the frequency is fixed by the injected signal, and the phase noise is reduced.

Figure 6:
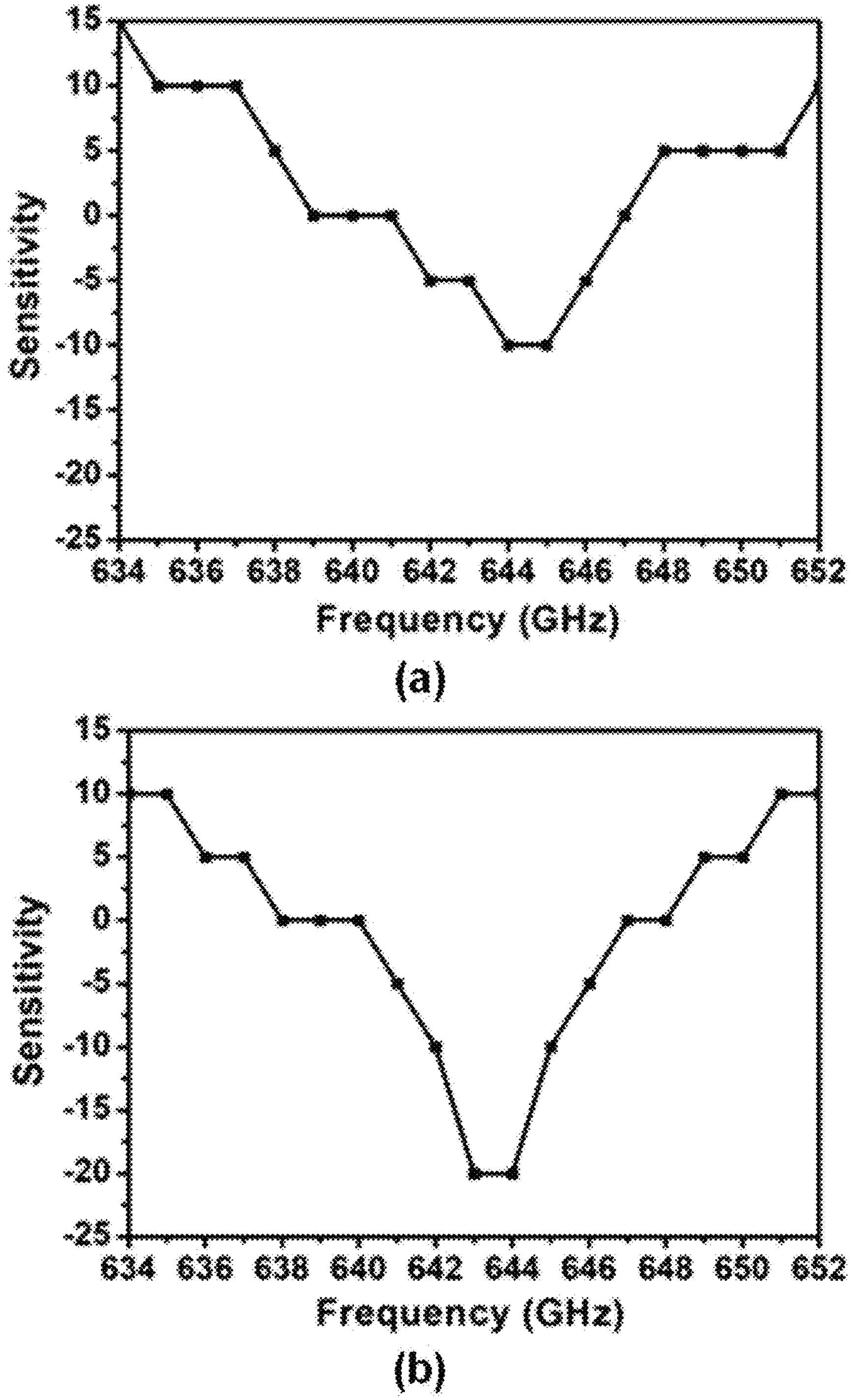
FIG. 6 is a diagram comparing the minimum input signal strength required for injection locking of the oscillator array according to the conventional method and an embodiment of the present invention.

FIG. 6 compares the minimum input signal strength required for injection locking of the oscillator array according to the prior art and an embodiment of the present disclosure. Compared to the prior art, the injection locking circuit of the oscillator array according to the present disclosure has a shorter transmission line length for the injected signal, reducing losses and allowing the signal injected into each oscillator to be relatively stronger and more effectively locked.

Therefore, it can be seen that the injection locking circuit of the oscillator array according to an embodiment of the present disclosure requires a lower signal strength for injection locking. In the case of an injection locking oscillator array in the 600 GHz band, the output power is 13.1 dBm at 641 GHz, and the minimum signal strength and range for injection locking are 10 GHz when the input signal is at 0 dBm.

In the case of the injection locking circuit (320) that injects the injection locking signal into only some of the oscillators to form a symmetric structure in the oscillator array arranged in a square matrix according to an embodiment of the present invention, there is an advantage in that the injection locking circuit (320) can be implemented without changing the structure or layout of the oscillator array. Additionally, as mentioned above, by injecting the injection locking signal into some of the oscillators in the oscillator array using fewer, minimal 1:2 power splitters, the length of the transmission lines can be minimized, which also offers the advantage of reducing losses.

The present disclosure has been described above with reference to the embodiments thereof. It will be understood to those skilled in the art that the present disclosure may be implemented as a modified form without departing from an essential characteristic of the present disclosure. Therefore, the disclosed embodiments should be considered in an illustrative viewpoint rather than a restrictive viewpoint. The scope of the present disclosure is defined by the appended claims rather than by the foregoing description, and all differences within the scope of equivalents thereof should be construed as being included in the present disclosure.

What is claimed is:

1. An injection locked oscillator array circuit device, comprising:

an oscillator array comprising a plurality of oscillators arranged in an N×N square matrix, wherein N is an integer greater than or equal to 4;

an injection locking circuit configured to inject an injection locking signal into a proper subset of the plurality of oscillators, less than all of the plurality of oscillators, the proper subset being located in a symmetric structure within the oscillator array, wherein the injection locking circuit comprises:

a first power divider configured to distribute the injection locking signal and output distributed signals through a first transmission line and a second transmission line;

a second power divider configured to distribute a signal delivered through the first transmission line and inject distributed signals into a first oscillator and a second oscillator among the oscillators via a third transmission line and a fourth transmission line; and a third power divider configured to distribute a signal delivered through the second transmission line and inject distributed signals into a third oscillator and a fourth oscillator among the oscillators via a fifth transmission line and a sixth transmission line, wherein the first oscillator, the second oscillator, the third oscillator and the fourth oscillator are oscillators located in a same row or a same column of the N×N square matrix.

2. The injection locked oscillator array circuit device of claim 1, wherein each oscillator forming the oscillator array is phase-coupled to each other via a coupling network, wherein oscillators not receiving the injection locking signal are injection-locked via the coupling network based on injection locking of the proper subset, and the plurality of oscillators are injected-locked oscillators operating in a sub-millimeter wave band of 300 GHz or higher.

3. A method of designed an injection-locked oscillator circuit, comprising the step of:

arranging a plurality of oscillators to form an N×N square matrix, wherein N is an integer greater than or equal to 4;

placing an injection locking circuit to inject an injection locking signal into a proper subset of the plurality of oscillators, less than all of the plurality of oscillators, in the N×N square matrix;

wherein the oscillators into which the injection locking signal is injected are located in a symmetric structure, wherein placing the injection locking circuit comprises:

distributing, via a first power divider, the injection locking signal and output distributed signals through a first transmission line and a second transmission line;

distributing, via a second power divider, a signal delivered through the first transmission line and inject distributed signals into a first oscillator and a second oscillator among the plurality of oscillators via a third transmission line and a fourth transmission line; and distributing, via a third power divider, a signal delivered through the second transmission line and inject distributed signals into a third oscillator and a fourth oscillator among the plurality of oscillators via a fifth transmission line and a sixth transmission line, wherein the first oscillator, the second oscillator, the third oscillator, and the fourth oscillator are oscillators located in a common row or in a common column of the N×N square matrix.

* * * * *